United States Patent

[11] 3,597,635

[72] Inventor Michael Reich
Stuttgart-Wangen, Germany
[21] Appl. No 804,411
[22] Filed Mar. 5, 1969
[45] Patented Aug. 3, 1971
[73] Assignee Eastman Kodak Company
Rochester, N.Y.
[32] Priority Apr. 27, 1968
[33] Germany
[31] P 17 63 283.6

[54] TRIGGER CIRCUIT
1 Claim, 1 Drawing Fig.

[52] U.S. Cl. .......... 307/282,
307/254, 307/270, 307/273, 307/275, 307/292
[51] Int. Cl. .......... H03k 3/284
[50] Field of Search .......... 307/254,
270, 273, 275, 282, 291, 292

[56] References Cited
UNITED STATES PATENTS

| | | | |
|---|---|---|---|
| 2,898,478 | 8/1959 | Hangen | 307/273 |
| 3,066,231 | 11/1962 | Slobodzinski et al. | 307/292 X |
| 3,143,667 | 8/1964 | Smithson | 307/273 |
| 3,155,947 | 11/1964 | Yoshida | 307/282 X |
| 3,278,756 | 10/1966 | Weber | 307/273 X |
| 3,312,904 | 4/1967 | Stertt et al. | 307/273 X |
| 3,379,897 | 4/1968 | Kominski | 307/275 X |

*Primary Examiner*—Donald D. Forrer
*Assistant Examiner*—R. C. Woodbridge
*Attorneys*—Robert W. Hampton and Daniel E. Sragow

ABSTRACT: A trigger circuit includes a two stage amplifier having a positive feedback path through a diode, so that the circuit is positively switched. The circuit has particular applicability to control of inductive loads.

PATENTED AUG 3 1971 3,597,635
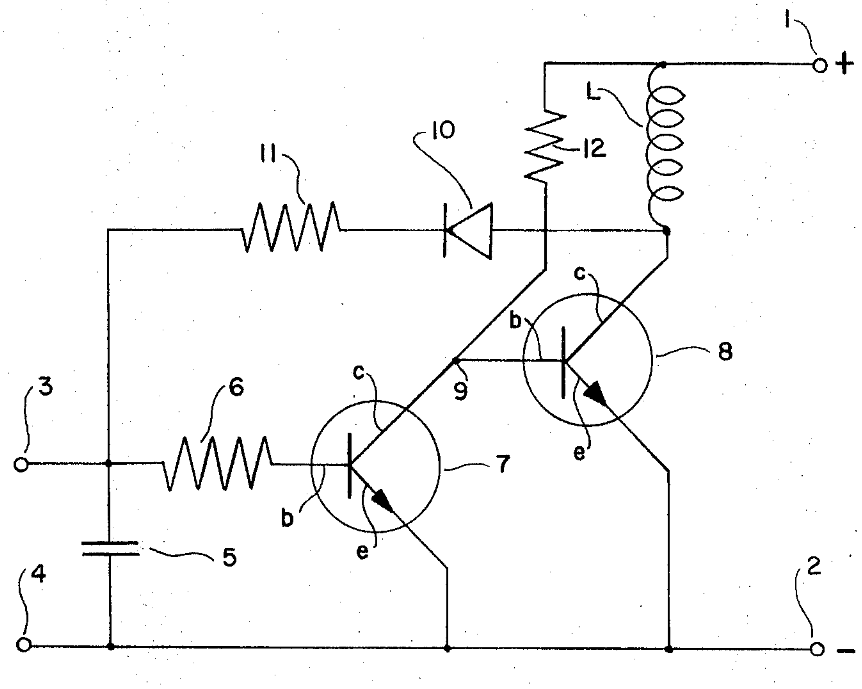
MICHAEL REICH
INVENTOR.
BY Daniel E. Sragow
Robert W. Hampton
ATTORNEYS

TRIGGER CIRCUIT

BACKGROUND OF THE INVENTION

1. Field of the Invention

The present invention relates to an electronic switching circuit for use with an inductive load such as an electromagnet. One application of the invention is the control of an electromagnet arranged to position for instance mechanical and/or electromechanical elements arranged to influence the exposure of material for photographic purposes.

2. Description of the Prior Art

Switching circuits for inductive loads are known in the prior art. It is also known that such prior art circuits tend to oscillate when they undergo a transition from one switching state to another due to inductivity reactions of the inductive load on the active elements of the switching current.

SUMMARY OF THE INVENTION

An object of the invention, therefore, is to improve the switching response of a switching circuit so as to substantially eliminate inductivity reactions.

Another object of the invention is to provide an improved low cost switching circuit.

In accordance with one embodiment of the invention an electronic switching circuit comprises an electrically conductive input element such as a first transistor and an electrically conductive output element such as a second transistor and is characterized by a feedback circuit connecting the collector of the output transistor with the base of the input transistor through a series circuit including a diode and a high-impedance resistance. When the switching circuit is used to disconnect an inductive load from a power source the back emf generated by the inductive load during a switching operation is applied by the feedback circuit to the base electrode of the first transistor to prevent inductive reaction of the load from affecting the switching operation.

BRIEF DESCRIPTION OF THE DRAWING

The invention will be better understood from the following detailed description when read in view of the drawing wherein:

FIG. 1 shows a circuit diagram of a preferred embodiment of the invention.

DESCRIPTION OF A PREFERRED EMBODIMENT

Referring to the drawing, one embodiment of a switching circuit in accordance with the invention comprises a two stage circuit having input terminals 3 and 4 to which a control signal is applied and a pair of terminals 1 and 2 for connection to a source of electrical current having the polarity as illustrated. An inductive load L which may comprise for example the winding of an electromagnet has one end connected to the terminal 1, and the other end is connected through the switching circuit to the terminal 2 to control deenergization of the electromagnetic in response to a control voltage across terminals 3 and 4.

In the disclosed embodiment, the switching circuit includes an input amplifying stage defined by means such as a transistor 7 having a base or control electrode *b*, an emitter electrode *e* and a collector electrode *c*. The base electrode *b* of transistor 7 is connected to terminal 3 by a resistance 6 and the emitter electrode *e* is electrically connected to the terminals 4 and 2. A blocking capacitance 5 may be electrically connected across the input terminals 3 and 4 as shown.

The switching circuit further includes an output amplifying stage defined by means such as transistor 8 having a base or control electrode *b*, an emitter electrode *e*, and a collector electrode *c*. The base electrode *b* of transistor 8 is connected to the collector terminal *c* of transistor 7 at a junction 9, which is connected through a resistor 12 to the terminal 1. The emitter electrode *e* of transistor 8 is connected to input terminal 4 and supply terminal 2. The collector terminal *c* of transistor 8 is connected to one side of load L.

The above circuit operates as follows. When a DC voltage is applied across the terminals 1 and 2 as shown, the transistor 8 is forward biased into conduction to energize the coil L, and transistor 7 is reverse biased to a nonconductive state. As the potential on input terminal 3 increases, the base electrode *b* of transistor 7 becomes positive with respect to its emitter electrode *e* thus tending to render the transistor 7 conductive. When transistor 7 is conductive, its collector electrode *c* has substantially the same potential as terminal 2 which reduces the potential on the base electrode *b* of transistor 8. The drop in potential of base *b* of transistor 8 causes transistor 8 to become nonconductive to thus deenergize inductive load L. However, since an inductor tends to generate a back emf when an applied voltage is disconnected, a voltage is produced the electromagnet L when the transistor 8 turns off, which tends to cause the transistor 8 to again conduct to reenergize the electromagnet L. Thus the inductive load tends to inhibit positive switching by the described switching circuit.

In accordance with the invention a feedback path is provided which provides positive switching. In the disclosed embodiment this feedback path comprises a diode 10 connected from the collector *c* of the transistor 8 through a resistance 11 to the input terminal 3. When the input potential on terminal 3 reverses the diode 10 is backed biased so that it does not conduct. When transistor 8 becomes nonconductive, the back emf generated across inductance L overcomes the back bias on the diode 10 which then conducts to effectively increase the potential at the input terminal 3 and the transistor base 7*b* to insure that transistor 7 remains on and transistor 8 remains off. In this manner positive switching of the inductive load L is attained.

It will be understood that the transistors of opposite conductivity types could be used. It is also apparent that vacuum tubes or other switching devices could be employed.

The invention has been described in detail with particular reference to preferred embodiments thereof, but it will be understood that variations and modifications can be effected within the spirit and scope of the invention.

I claim:

1. An electronic trigger circuit for uncoupling an inductive load from a pair of power-input terminals connectable to a DC voltage source in response to application of a predetermined minimum voltage at a signal-input terminal, said trigger circuit comprising:

a. a first transistor having collector, base and emitter electrodes, the collector electrode being coupled through said inductive load to the positive power-input terminal, the emitter electrode being coupled to the negative power-input terminal, and the base electrode being coupled through a resistance to the positive power-input terminal to bias said first transistor conductive when a DC voltage is applied across the power-input terminals;

b. a second transistor having base emitter and collector electrodes, the base electrode being coupled to said signal input terminal and through a capacitor to the negative power-input terminal, the emitter electrode being coupled to the negative power-input terminal, and the collector electrode being coupled to the base electrode of said first transistor, said second transistor being normally in a nonconductive state when a DC voltage is applied across the power-input terminals and being adapted to switch to a conductive state to bias said first transistor to a nonconductive state in response to a predetermined minimum voltage being applied to the signal-input terminal; and c. a diode having anode and cathode terminals, the anode terminal being coupled to the collector electrode of said first transistor, and the cathode being electrically coupled to the base electrode of said second transistor to provide a feedback path for opposing emf developed by the inductive load when said first transistor is rendered nonconductive to prevent said first transistor from being switched back to its conductive state by said opposing emf.